United States Patent
Hong et al.

(10) Patent No.: US 8,604,489 B2
(45) Date of Patent: Dec. 10, 2013

(54) MASK FRAME ASSEMBLY FOR THIN LAYER DEPOSITION AND METHOD OF MANUFACTURING ORGANIC LIGHT EMITTING DISPLAY DEVICE BY USING THE MASK FRAME ASSEMBLY

(75) Inventors: Jae-Min Hong, Yongin (KR); Kyung-Han Kim, Yongin (KR); Ho-Eoun Kim, Yongin (KR)

(73) Assignee: Samsung Display Co., Ltd., Gihheung-Gu, Yongin, Gyeonggi-Do (KR)

( * ) Notice: Subject to any disclaimer, the term of this patent is extended or adjusted under 35 U.S.C. 154(b) by 0 days.

(21) Appl. No.: 12/987,360

(22) Filed: Jan. 10, 2011

(65) Prior Publication Data

US 2011/0171768 A1    Jul. 14, 2011

(30) Foreign Application Priority Data

Jan. 11, 2010    (KR) ........................ 10-2010-0002376

(51) Int. Cl.
*H01L 29/18*    (2006.01)
*H01L 33/00*    (2010.01)

(52) U.S. Cl.
USPC ................................. 257/88; 257/59; 257/280

(58) Field of Classification Search
USPC ......... 438/22, 34; 257/E33.001, E33.013, 40, 257/59, 88, 280; 118/504
See application file for complete search history.

(56) References Cited

U.S. PATENT DOCUMENTS

| 2002/0190629 | A1  | 12/2002 | Jeon et al. |       |
|--------------|-----|---------|-------------|-------|
| 2003/0101932 | A1* | 6/2003  | Kang ......................... | 118/504 |
| 2006/0012290 | A1* | 1/2006  | Kang ............................. | 313/504 |
| 2008/0000420 | A1  | 1/2008  | Kim et al.  |       |
| 2009/0260566 | A1  | 10/2009 | Landgraf et al. |   |
| 2009/0297768 | A1  | 12/2009 | Ko          |       |
| 2010/0055810 | A1* | 3/2010  | Sung et al. ...................... | 438/22 |

FOREIGN PATENT DOCUMENTS

| KR | 20020085458   | 11/2002 |
| KR | 20030010181   | 2/2003  |
| KR | 1020030046090 | 6/2003  |
| KR | 20030056817 A | 7/2003  |

(Continued)

OTHER PUBLICATIONS

Korean Registration Determination Certificate issued by KIPO on Aug. 16, 2012 (corresponding KR Patent Application No. 10-2010-0002376).

*Primary Examiner* — Walter H Swanson
*Assistant Examiner* — Wilner Jean Baptiste
(74) *Attorney, Agent, or Firm* — Robert E. Bushnell, Esq.

(57) ABSTRACT

A mask frame assembly for thin film deposition includes a frame including an opening portion, and a plurality of unit mask strips that are fixed to the frame after a tensile force is applied to both of end portions of the unit mask strips in a lengthwise direction of the unit mask strips. Each of the plurality of unit mask strips includes a plurality of unit masking pattern portions each including a plurality of opening patterns. Before the tensile force is applied to both of the end portions of the unit mask strips in the lengthwise direction and the unit mask strips are fixed to the frame, a width of each of the unit masking pattern portions in a widthwise direction perpendicular to the lengthwise direction increases as a function of a closeness of a portion of the unit masking pattern portion where the width is measured to a central portion of each of the unit masking pattern portions.

17 Claims, 6 Drawing Sheets

(56) References Cited

FOREIGN PATENT DOCUMENTS

| KR | 20060018313 A | 3/2006 |
| KR | 1020060056193 | 5/2006 |
| KR | 20060123946 A | 12/2006 |
| KR | 1020090123590 | 12/2009 |

* cited by examiner

MASK FRAME ASSEMBLY FOR THIN LAYER DEPOSITION AND METHOD OF MANUFACTURING ORGANIC LIGHT EMITTING DISPLAY DEVICE BY USING THE MASK FRAME ASSEMBLY

CLAIM OF PRIORITY

This application makes reference to, incorporates the same herein, and claims all benefits accruing under 35 U.S.C. §119 from an application earlier filed in the Korean Intellectual Property Office on the 11 Jan. 2010 and there duly assigned Serial No. 10-2010-0002376.

BACKGROUND OF THE INVENTION

1. Field of the Invention

The present invention relates to a mask frame assembly and a method of manufacturing an organic light emitting display device by using the mask frame assembly. More particularly, the present invention relates to a mask frame assembly for thin film deposition that reduces a position error of unit masking pattern portions, and a method of manufacturing an organic light emitting display device by using the mask frame assembly.

2. Description of the Related Art

Organic light emitting display devices are self-emitting display devices that have wide viewing angles, excellent contrast, and fast response rates. Thus, they have been considered as the next generation display devices.

SUMMARY OF THE INVENTION

One aspect of the present invention provides an improved mask frame assembly for thin film deposition.

Another aspect of the present invention provides a mask frame assembly for thin film deposition that includes a plurality of unit mask strips and reduces errors in positions of a plurality of unit masking pattern portions included in each unit mask strip, and an organic light emitting display device using the mask frame assembly.

According to an aspect of the present invention, a mask frame assembly for thin film deposition includes a frame including an opening portion and a plurality of unit mask strips that are fixed to the frame after a tensile force is applied to both of end portions of the unit mask strips in a lengthwise direction of the unit mask strips. Each of the plurality of unit mask strips includes a plurality of unit masking pattern portions each including a plurality of opening patterns. Before the tensile force is applied to both of the end portions of the unit mask strips in the lengthwise direction and the unit mask strips are fixed to the frame, a width of each of the unit masking pattern portions in a widthwise direction perpendicular to the lengthwise direction increases as a function of a closeness of a portion of the unit masking pattern portion where the width is measured to a central portion of each of the unit masking pattern portions.

The width of each of the unit masking pattern portions in the widthwise direction may be designed to increase with a predetermined curvature in a direction toward the central portion of each of the unit masking pattern portions.

The predetermined curvature may be determined in consideration of at least one selected from the group consisting of a thickness of each of the unit mask strips, a material of each of the unit mask strips, a size of each of the unit masking pattern portions, and a shape, a size, and a position of each of a plurality of opening patterns included in each of the unit masking pattern portions.

Before the tensile force is applied to both of the end portions of the unit mask strips in the lengthwise direction and the unit masking pattern portions are fixed to the frame, a distance between a left end of a leftmost opening pattern and a right end of a rightmost opening pattern from among opening patterns existing on the same row in the widthwise direction increases in a direction from both of the end portions of the unit masking pattern portions toward the central portions of the unit masking pattern portions. The distance is referred to as a total pitch.

The opening patterns of each of the unit masking pattern portions existing on the same column in the lengthwise direction may be designed to be larger as a function of the closeness of the opening patterns to the central portion of the unit masking pattern portion. The opening patterns of each of the unit masking pattern portions existing on the same row in the widthwise direction may be designed to be larger as a function of the closeness of the opening patterns to both of end portions of the unit masking pattern portion in the widthwise direction.

After a tensile force is applied to both the end portions of the unit mask strips in the lengthwise direction and the unit masking pattern portions are fixed to the frame, the total pitch may be substantially constant in a direction from both the end portions of each of the unit masking pattern portions in the lengthwise direction toward the central portion of each of the unit masking pattern portions.

In each unit mask strip, the central portions of the unit masking pattern portions may be approximately constantly aligned with both of the end portions of the unit masking pattern portions in the lengthwise direction to form a substantially straight line.

The plurality of opening patterns of each of the unit masking pattern portions may have dot shapes and may be arranged in a zigzag manner.

The plurality of opening patterns of each of the unit masking pattern portions may be arranged in strips.

The plurality of opening patterns of each of the unit masking pattern portions may have dot shapes and may be aliened with one another.

The plurality of unit mask stripes may have a predetermined tension.

The plurality of unit mask stripes may have nickel or a nickel alloy.

Each of the plurality of unit mask stripes may further include a blocking portion that surrounds the plurality of unit masking pattern portions.

The plurality of unit mask stripes may be fixed to the frame using welding.

The plurality of unit mask stripes may be fixed to the frame using laser welding.

According to another aspect of the present invention, a method is provided for manufacturing an organic light-emitting display device including an organic film disposed between a first electrode and a second electrode that are arranged opposite to each other on a substrate. The method includes depositing the organic film through a mask frame assembly for thin film deposition. The mask frame assembly includes a frame including an opening portion, and a plurality of unit mask strips having both of end portions in a lengthwise direction welded and fixed to the frame. Each of the plurality of unit mask strips includes a plurality of unit masking pattern portions each including a plurality of opening patterns. Before a tensile force is applied to both of the end portions of the unit mask strips and the unit mask strips are fixed to the frame, a distance between rightmost and leftmost opening patterns from among opening patterns existing on the same row in a widthwise direction perpendicular to the lengthwise direction increases as a function of the closeness of the row to the central portion of each of the unit masking pattern portions. After a tensile force is applied to both of the end portions of the unit mask strips in the lengthwise direction and the unit masking pattern portions are fixed to the frame, the distance between rightmost and leftmost opening patterns from among opening patterns existing on the same row in the widthwise direction perpendicular to the lengthwise direction is substantially constant in a direction from both of the end portions of each of the unit masking pattern portions in the lengthwise direction toward the central portion of each of the unit masking pattern portions.

The organic film may further include at least an organic emitting layer, and the is organic emitting layer may be formed by deposition performed by the mask frame assembly for thin film deposition.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

An Organic light emitting display device may be constructed with a first electrode formed on a transparent insulation substrate to have a predetermined pattern, an organic film including an organic emitting layer formed on the first electrode by vacuum deposition, and a second electrode formed on the upper surface of the organic film.

When the organic light emitting display devices having such a structure is manufactured, the first electrode may be patterned by wet etching such as a photolithography method. The organic film, particularly, the organic emitting layer emitting a predetermined color of light, however, is weak against moisture and oxygen and thus may not be patterned by wet etching.

To address this problem, there has been proposed a method of depositing and patterning, at the same time, an organic light-emitting material that is used to form an organic emitting layer. In other words, after a first electrode is formed and patterned on a substrate by a photolithography method or the like, a mask of a predetermined pattern is closely attached to the resultant substrate, and an organic light-emitting material is deposited on the resultant substrate to which the mask has been closely attached, thereby directly forming an organic emitting layer having a predetermined pattern.

In the formation of the organic emitting layer pattern by deposition as described above, a mask with opening patterns is mounted on an object on which an organic emitting layer is to be formed, and then deposition is performed on the object, so that an organic emitting layer is formed only on areas exposed through the opening patterns and thus deposition is achieved to obtain a desired pattern.

In the contemporary art, a mask is supported on a frame having an opening portion. A central portion of the mask may sag due to a self-weight of the mask. In this case, when the mask is closely attached to a substrate or the like to achieve deposition, the central portion of the mask does not adhere to the substrate or the like due to the self-weight of the mask. Such a problem deteriorates according to an increase in sizes of organic light emitting display devices.

In addition, if a tensile force is applied to a mask in all directions equally and then the mask is fixed to a frame in order to prevent the mask from sagging due to its self weight, a pitch between opening patterns included in each unit masking pattern portion is distorted, making it difficult to adjust the distortion within an allowance range. Therefore, the organic emitting layer cannot be formed at an accurate location, leading to a degradation of the quality of image display.

Hereinafter, the present invention will be described more fully with reference to the accompanying drawings, in which exemplary embodiments of the invention are shown.

Figure 1:
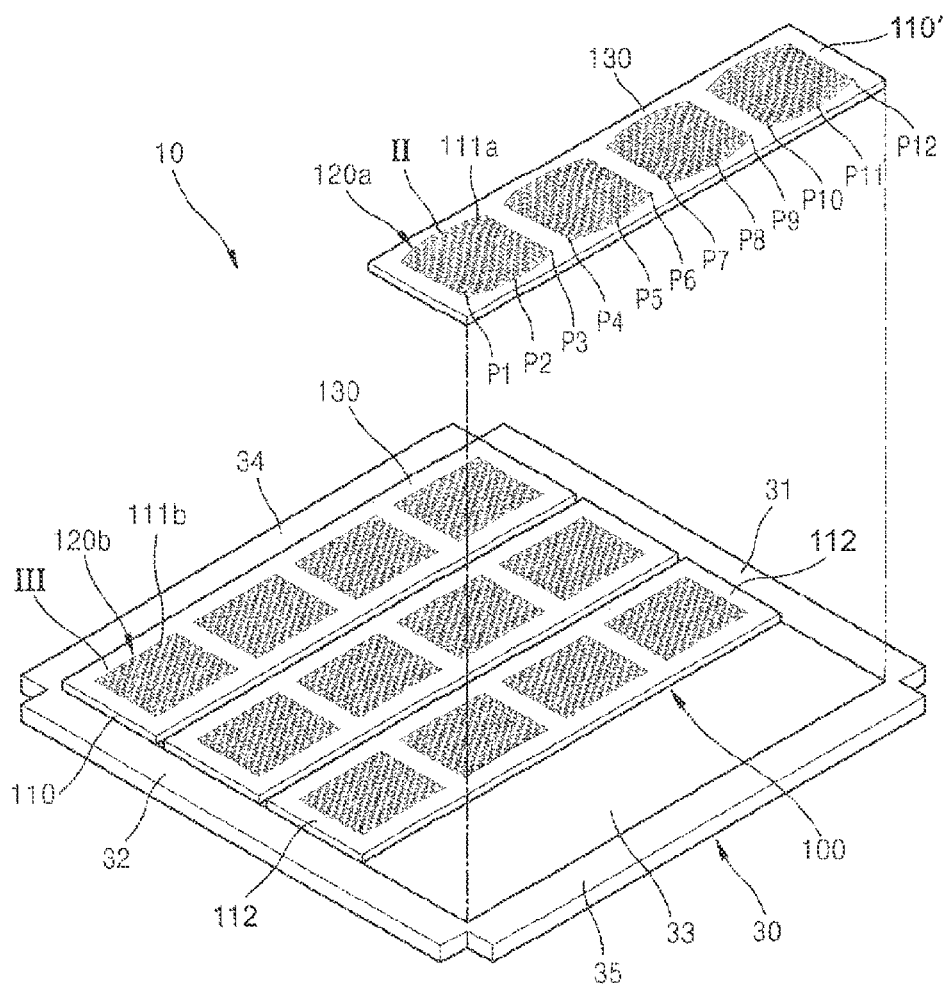
FIG. 1 is an exploded oblique view of a mask frame assembly for thin film deposition, according to an embodiment of the present invention.

FIG. 1 is an exploded oblique view of a mask frame assembly 10 for thin film deposition, constructed as an embodiment according to the principles of the present invention.

Referring to FIG. 1, mask frame assembly 10 includes a frame 30 and a plurality of unit mask strips 110, 110'. Both ends of each one of the plurality of unit mask strips 110, 110' in a lengthwise direction of unit mask strip 110, 110' (a direction along the y-axis) are supported on frame 30. The plurality of unit mask strips 110 constitute a mask 100. FIG. 1 illustrates a state where unit mask strips 110 are fixed to frame 30, while mask strip 110' is not yet fixed to frame 30 yet.

Frame 30 includes first support portions 31 and 32 that are installed in parallel with each other and second support portions 34 and 35 that are connected to ends of first support portions 31 and 32 in order to form an opening 33. Opening 33 may have a rectangular shape. Second support portions 34 and 35 are installed in parallel with unit mask strips 110, 110' and may be formed of an elastic material. The present invention is, however, not limited thereto. First support portions 31 and 32 and second support portions 34 and 35 may be integrally formed with each other.

Unit mask strips 110, to which a tensile force is applied, are fixed to and supported on frame 30 and thus frame 30 needs to have a sufficient hardness. Furthermore, frame 30 may have any structure as long as frame 30 does not interfere with attachment of mask 100 to an object on which deposition is to be performed.

Mask 100 includes the plurality of unit mask strips 110, 110' as described above. Although four unit mask strips 110, 110' are illustrated in FIG. 1, the number of unit mask strips 110, 110' included in mask 100 as illustrated in FIG. 1 is only an example, and the present invention is not limited thereto.

Since mask 100 is divided into a plurality of unit mask strips 110, 110' and patterns are formed on unit mask strips 110, 110', mask 100 may be prevented from sagging due to a self-weight of mask 100.

Each of unit mask strips 110, 110' is a rectangular thin plate in which a plurality of unit masking pattern portions 120a and 120b are formed at predetermined intervals in a lengthwise direction (a direction of y) of unit mask strips 110, 110'. A blocking portion 130 is formed around unit masking pattern portions 120a and 120b. Each one of unit masking pattern portions 120a and 120b includes a plurality of opening patterns 111a and 111b. As illustrated in FIG. 1, a shape of unit masking pattern portion 120a before the corresponding unit mask strip 110' is fixed to frame 30 is different from a shape of unit masking pattern portion 120b after the corresponding unit mask strip 110 is fixed to frame 30. A detailed description thereof will be made later.

Each of unit mask strips 110, 110' may be a magnetic thin plate, may be formed of nickel or a nickel alloy, and may be formed of a nickel-cobalt alloy that allows convenient fine patterning and excellent surface smoothness.

Before unit mask strip 110' is fixed on frame 30, opening patterns 111a included in unit mask strip 110 may be finely formed with excellent surface smoothness using an electro forming method. Electro forming is a metal forming process that uses electrodeposition to plate a base form, known as a mandrel, which is removed after plating. Opening patterns 111a may also be manufactured using an etching method. In more detail, opening patterns 111a may be manufactured by forming a photoresist layer having the same pattern as opening patterns 111a on a thin plate using a photoresist, or attaching a film having the same pattern as opening patterns 111a on the thin plate, and then etching the thin plate.

A predetermined tensile force is applied to each of unit mask strips 110 in a lengthwise direction (a direction of ±y) of unit mask strip 110, and both ends 112 of each of unit mask strips 110 in the lengthwise direction are fixed to frame 30. In this regard, all opening patterns 111b of unit mask strips 110 are disposed inside opening portion 33 of frame 30. Although a variety of methods, such as laser welding, resistance thermal welding, or the like, may be used to fix unit mask strips 110 to frame 30, laser welding may be used in terms of a change in precision or the like. In this regard, unit mask strips 110 may be arranged with a predetermined gap between each other and may be welded to frame 30.

According to the present embodiment, the shape of unit masking pattern portion 120a before the corresponding unit mask strip 110' is fixed to frame 30 is different from a shape of unit masking pattern portion 120b after the corresponding unit mask strip 110 is fixed to frame 30.

Figure 2:
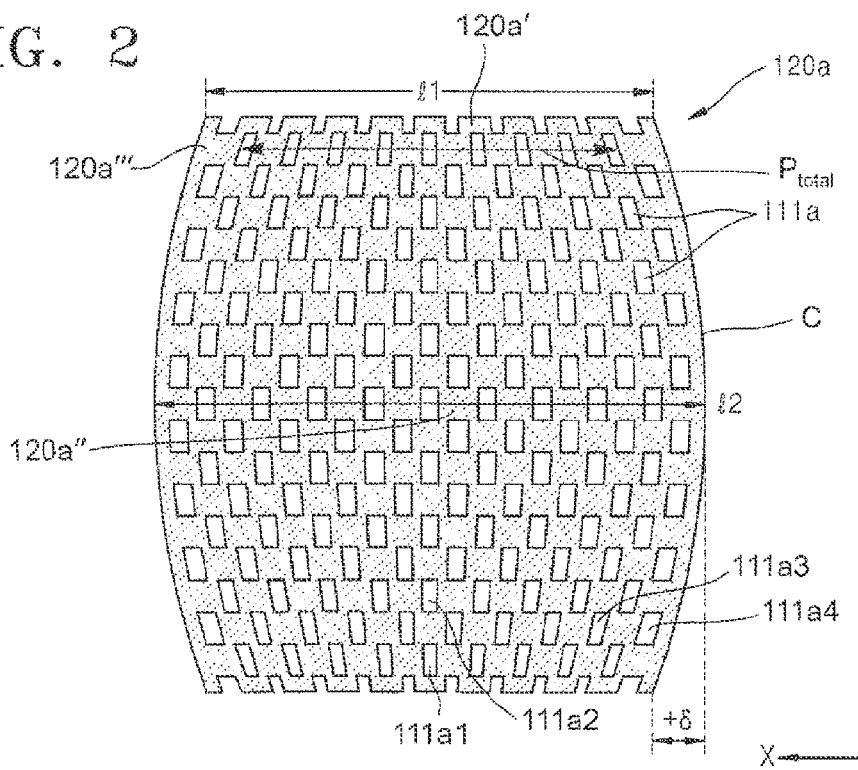
FIG. 2 is a schematic top view illustrating a unit masking pattern portion included in the mask frame assembly illustrated in FIG. 1 before unit mask strips are fixed on a frame, according to an embodiment of the present invention.

FIG. 2 is a schematic top view illustrating each of unit masking pattern portions 120a formed on unit mask strip 110' of mask frame assembly 10, which are not yet fixed to frame 30, constructed as an embodiment according to the principles of the present invention.

Referring to FIG. 2, before a tensile force is applied to both of end portion 120a' of each unit masking pattern portion 120a in a lengthwise direction (the direction of ±y) and unit masking pattern portion 120a is fixed to frame 30, each unit masking pattern portion 120a is designed so that a width l of each unit masking pattern portion 120a in a widthwise direction (a direction of ±x) increases the closer to a central portion 120a" of unit masking pattern portion 120a. In other words, width l of each unit masking pattern portion 120a in the widthwise direction increases as a function of a closeness of a portion of unit masking pattern portion 120a where the width l is measured. In the present invention and the claims, the function is, by way of example, an indirect relationship between a width and a distance. That is, $$l1 < l2 \quad (1)$$

where l is the width of a lengthwise end portion 120a' of unit masking pattern portion 120a, and l2 is a width of central portion 120a" of unit masking pattern portion 120a. In other words, central portion 120a" of unit masking pattern portion 120a protrudes about δ from both widthwise end portions 120a''' of unit masking pattern portion 120a in the widthwise direction (a direction of ±x). That is, $$l2 - l1 = 2 \times \delta \quad (2)$$

In the present specification and the claims, a central portion 120a" refers to a geometric center portion of unit masking pattern portion 120a, a lengthwise end portion 120a' refers to an end portion of unit masking pattern portion 120a in the lengthwise direction (the direction of ±y); and a widthwise end portion refers to an end portion of unit masking pattern portion 120a in the widthwise direction (the direction of ±x). Width l of unit masking pattern portion 120a in the widthwise direction (the direction of ±x) may increase with a predetermined curvature C as approaching central portion 120" of unit masking pattern portion 120a. In other words, when a distance between a left end of a leftmost opening pattern 111a and a right end of a rightmost opening pattern 111a from among opening patterns 111a existing on the same row in the widthwise direction (direction of ±x) is referred to as a total pitch P, unit masking pattern portion 120a may be designed so that total pitch P increases as a function of the closeness of the raw to central portion 120a" of unit masking pattern portion 120a and also designed to increase with the predetermined curvature C as approaching central portion 120a" of unit masking pattern portion 120a.

Opening patterns 111a existing on the same column in the lengthwise direction (direction ±y) may be designed to be larger as a function of the closeness of opening patterns 111a to central portion 120a" of unit masking pattern portion 120a. As illustrated in FIG. 2, opening pattern 111a2 disposed closer to central portion 120a" of unit masking pattern portion 120a, is larger than opening pattern 111a1 disposed in the same column with opening pattern 111a2 and further away from central portion 120a" of unit masking pattern portion 120a. In addition, opening patterns 111a existing on the same row in the widthwise direction (direction ±x) may be designed to increase as a function of the closeness of opening patterns 111a to both of end portions 120a''' of unit masking pattern portion 120a in the widthwise direction (direction ±x). As illustrated in FIG. 2, opening pattern 111a3 disposed closer to central portion 120a" of unit masking pattern portion 120a, is larger than opening pattern 111a4 disposed in the same row with opening pattern 111a4 and further away from central portion 120a" of unit masking pattern portion 120a.

In general, an integrated mask is fixed to a frame after a tensile force is applied to the integrated mask in all directions.

Mask 100 divided into the plurality of unit mask strips 110 as illustrated in the present embodiment is, however, fixed to frame 30 after a tensile force is applied to unit mask strips 110 only in the lengthwise direction (direction ±y). In this case, unit mask strips 110 are shrunk in the widthwise direction (the direction of ±x) perpendicular to the tension direction (the direction of ±y) due to the tensile force applied in the tension direction (the direction of ±y) of unit mask strips 110.

A ratio of a strain of unit mask strip 110 in the widthwise direction ±x to a strain of unit mask strip 110 in the tension direction ±y is referred to as a Poisson ratio. The Poisson ratio may depend on a thickness or material of unit mask strip 110, or a shape, a size, a position, or the like of opening patterns 111a formed on unit masking pattern portion 120a. Unit masking pattern portion 120a illustrated in FIG. 2 is designed by compensating for all factors that affect the Poisson ratio.

Figure 3:
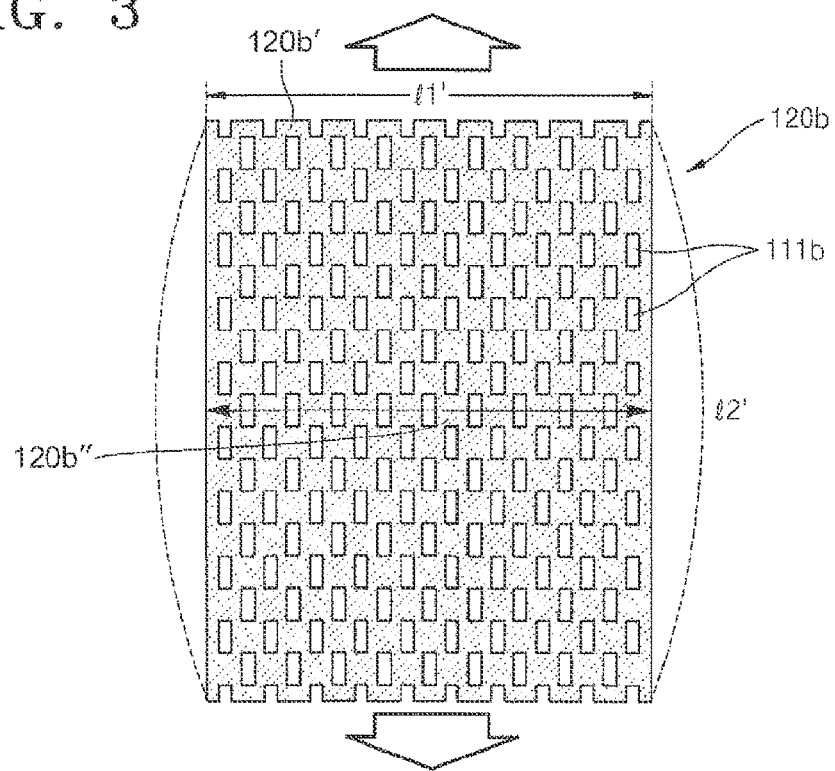
FIG. 3 is a schematic top view illustrating a unit masking pattern portion included in the mask frame assembly illustrated in FIG. 1 after the unit mask strips are fixed on the frame, according to another embodiment of the present invention.

FIG. 3 is a schematic top view illustrating each of unit masking pattern portions 120b formed on unit mask strip 110 of mask frame assembly 10 for thin film deposition, which are obtained after unit mask strips 110 are fixed to frame 30, constructed as an embodiment according to the principles of the present invention.

Referring to FIG. 3, after a tensile force is applied to both ends of unit mask strips 110 in the lengthwise direction (direction ±y) and unit mask strips 110 are fixed to frame 30, the width C of unit masking pattern portion 120b in the widthwise direction (the direction of ±x) perpendicular to the lengthwise direction (the direction of ±y) is substantially uniform. That is, $$l1' = l2' \quad (3)$$

where l1' is the width of a lengthwise end portion 120b' of unit masking pattern portion 120b in the lengthwise direction (direction ±x), and l2' is a width of a center portion 120b" of unit masking pattern portion 120b. In other words, opening patterns 111b of unit masking pattern portion 120b are arranged to have uniform total pitches and also uniform unit pitches. In the present specification and the claims, a unit pitch refers to a distance between two immediately adjacent opening patterns 111a. Accordingly, an organic material passing through opening patterns 111b arranged in this way is deposited at desired locations without errors.

Figure 4:
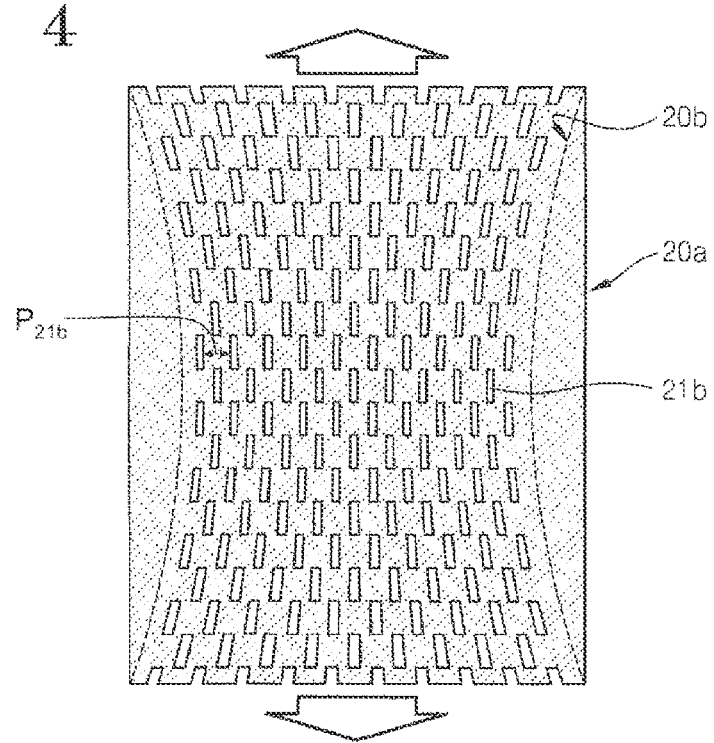
FIG. 4 is a schematic top view illustrating a shape of a unit masking pattern unit designed without considering compensation for Poisson shrinkage, to which a tensile force has been applied.

FIG. 4 is a schematic top view illustrating a unit masking pattern portion 20b designed without compensating for Poisson shrinkage, to which a tensile force has been applied, constructed as a comparative example.

In FIG. 4, reference numeral 20a refers to a unit masking pattern portion before a tensile force is applied to both ends of the unit masking pattern portion in the lengthwise direction (the direction of ±y), and reference numeral 20b refers to a unit masking pattern portion after the tensile force is applied to both ends of the unit masking pattern portion in the lengthwise direction (the direction of ±y). As illustrated in FIG. 4, when a tensile force is applied to unit mask strips designed without considering Poisson shrinkage and the unit mask strips are fixed to a frame, each unit masking pattern 20a included in each of the unit mask strips is shrunk in the widthwise direction (direction ±x) perpendicular to the tension direction (direction ±y). Consequently, a unit pitch $P_{21b}$ between opening patterns 21b included in unit masking pattern 20b obtained by the shrinkage of unit masking pattern 20a is changed, and an organic material pattern deposited via opening patterns 21b may be formed at undesired locations.

Figure 5:
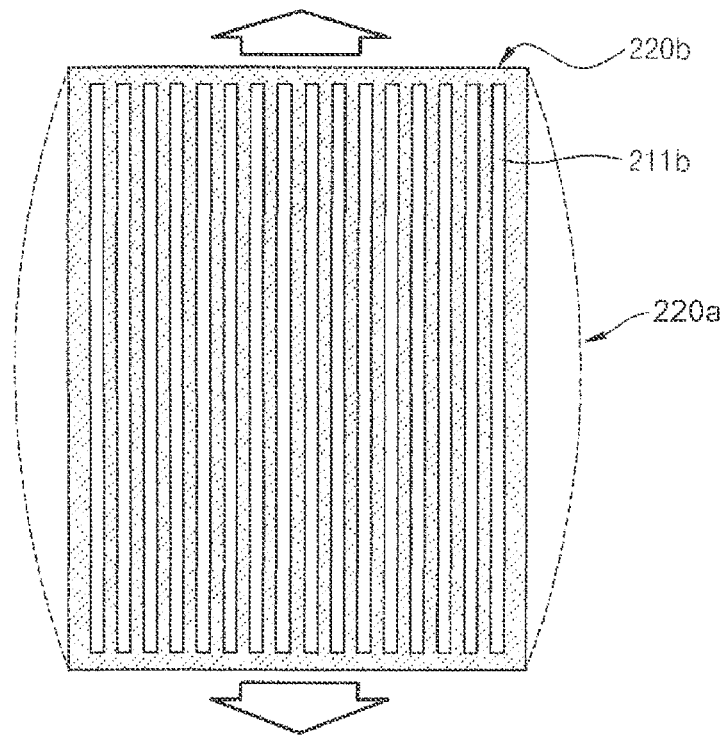
FIGS. 5 and 6 are schematic top views illustrating various examples of a unit masking pattern portion fixed to the frame, in the mask frame assembly illustrated in FIG. 1.
Figure 6:
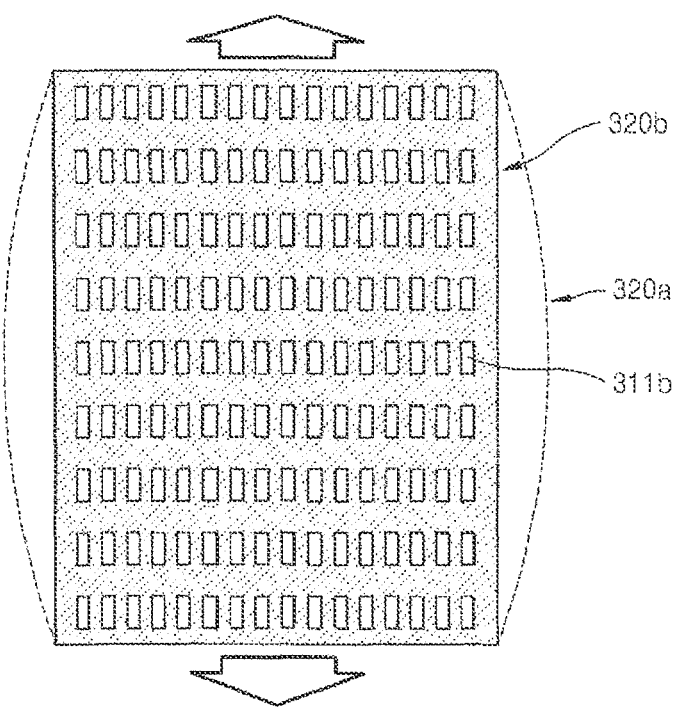

FIG. 5 is a schematic top view illustrating a unit masking pattern portion 220b fixed to frame 30 in mask frame assembly 10 for thin film deposition, constructed to another embodiment according to the principles of the present invention. FIG. 6 is a schematic top view illustrating a unit masking pattern portion 320b fixed to frame 30 in mask frame assembly 10 for thin film deposition, constructed to still another embodiment according to the principles of the present invention.

Unit masking pattern unit 120b in the previous embodiment as illustrated in FIGS. 1-3 includes opening patterns 111b shaped as dots and arranged in a zigzag manner. Unit masking pattern portion 220b of FIG. 5 includes opening patterns 211b arranged in strips, and unit masking pattern portion 320b of FIG. 6 includes opening patterns 311b shaped as dots and arranged in straight lines. A unit masking pattern portion according to the present invention may be designed in various shapes other than the shapes illustrated in FIGS. 3, 5, and 6 according to the design of an organic emitting layer.

Figure 7:
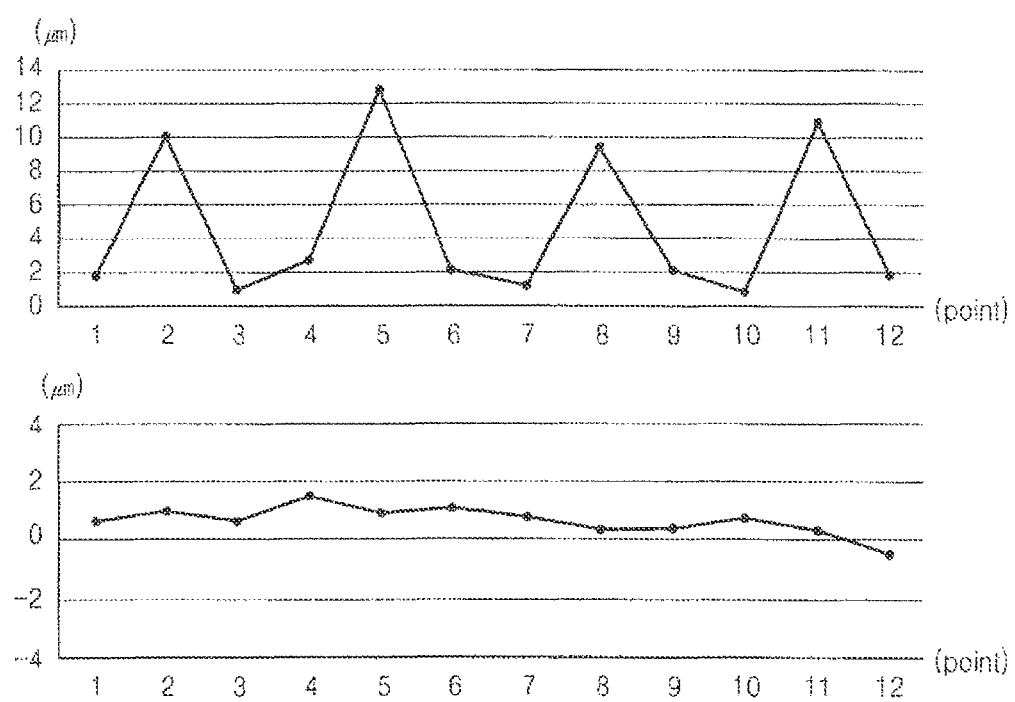
FIG. 7 illustrates graphs showing relative positions of the unit masking pattern units obtained before and after a tensile force is applied to each unit mask strip and the unit mask strip is fixed to the frame, in the mask frame assembly illustrated in FIG. 1.

FIG. 7 illustrates graphs showing relative positions of different measuring points of unit masking pattern units 120a and 120b obtained before and after a tensile force is applied to unit mask strips 110 and unit mask strips 110 are fixed to frame 30 in mask frame assembly 10 for thin film deposition.

In the embodiment as illustrated in FIGS. 1 through 3, unit mask strips 110 are fixed to frame 30, and each of unit mask strips 110 includes four (4) unit masking pattern portions 120a. Referring to FIGS. 1 and 7, a total of twelve (12) points including central points P2, P5, P8, and P11 of the four unit masking pattern portions 120a and end points P1, P3, P4, P6, P7, P9, P10, and P12 thereof are used as measuring points.

The upper graph of FIG. 7 schematically shows relative positions of measuring points P1 through P12 of the four unit masking pattern portions 120a with respect to a reference point (0) in a widthwise direction (the direction of ±x), before unit mask strips 110 are fixed to frame 30. Referring to FIG. 7, the widthwise distance δ (a distance measured along the direction of ±x) between end points P1, P3, P4, P6, P7, P9, P10, and P12 and central points P2, P5, P8, and P11 of the four unit masking pattern portions 120a are about 10~12 μm.

The lower graph of FIG. 7 schematically shows relative positions of measuring points P1 through P12 of the four unit masking pattern portions 120b with respect to a reference point (0) in a widthwise direction (the direction of ±x), after unit mask strips 110 are fixed to frame 30. Referring to FIG. 7, the widthwise distances δ (a distance measured along the direction of ±x) between end points P1, P3, P4, P6, P7, P9, P10, and P12 and central points P2, P5, P8, and P11 of the four unit masking pattern portions 120a are about 2 μm. That is, all of the measuring points of the four unit masking pattern units 120b, including central points P2, P5, P8, and P11, are located within an error range of 2 μm.

According to the graphs of FIG. 7, in mask frame assembly 10 for thin film deposition, the positions of central points P2, P5, P8, and P11 of the four unit masking pattern portions 120b obtained after unit mask strips 110 are fixed to frame 30 are almost aligned with end points P1, P3, P4, P6, P7, P9, P10, and P12 of the four unit masking pattern portions 120b, to form a substantially straight line Mask frame assembly 10 for thin film deposition may be used for a variety of thin film deposition, particularly, in a process of patterning an organic emission layer of an organic light emitting display device.

Figure 8:
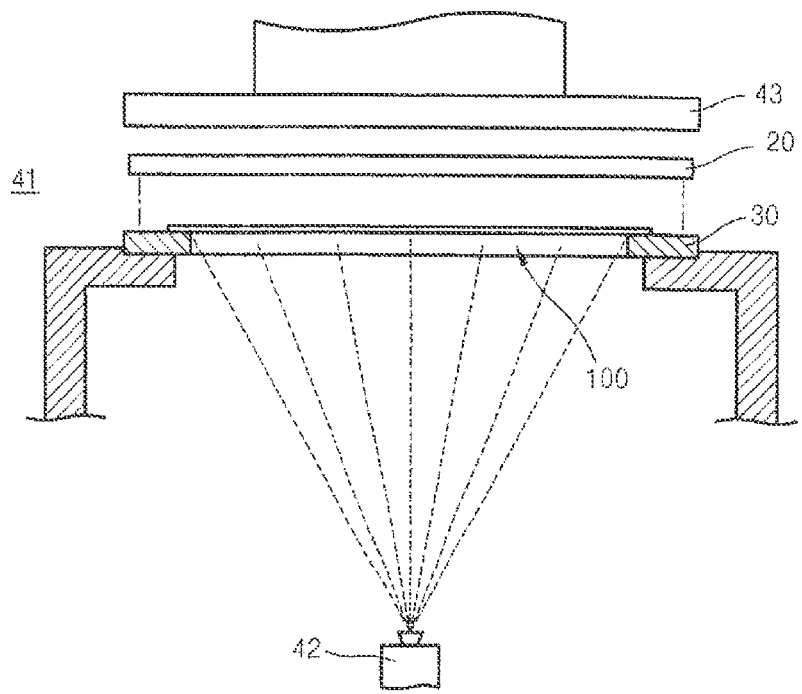
FIG. 8 is a schematic plan cross-sectional view of a deposition apparatus for depositing an organic material on a substrate, according to an embodiment of the present invention.

FIG. 8 schematically illustrates a deposition apparatus in which mask frame assemblies for thin film deposition are installed, as an embodiment according to the principles of the present invention.

Referring to FIG. 8, in order to deposit a thin film, namely, an organic emission layer for emitting red light, green light, and blue light, of an organic light emitting display device using mask 100, a substrate 20 on which the thin film is to be formed is disposed in a vacuum chamber 41. A thin film deposition crucible 42 for dispensing an organic material is installed in vacuum chamber 41. Mask frame assembly 10 is installed on a side of substrate 20 facing thin film deposition crucible 42, and substrate 20 on which the thin film is to be formed is mounted on an upper surface of mask frame assembly 10. A magnet unit 43 for adhering mask 100 supported on frame 30 to substrate 20 is driven on an upper surface of substrate 20 so that mask 100 is adhered to substrate 20. In this state, when thin film deposition crucible 42 operates, the organic material mounted on thin film deposition crucible 42 is vaporized and deposited on substrate 20.

Figure 9:
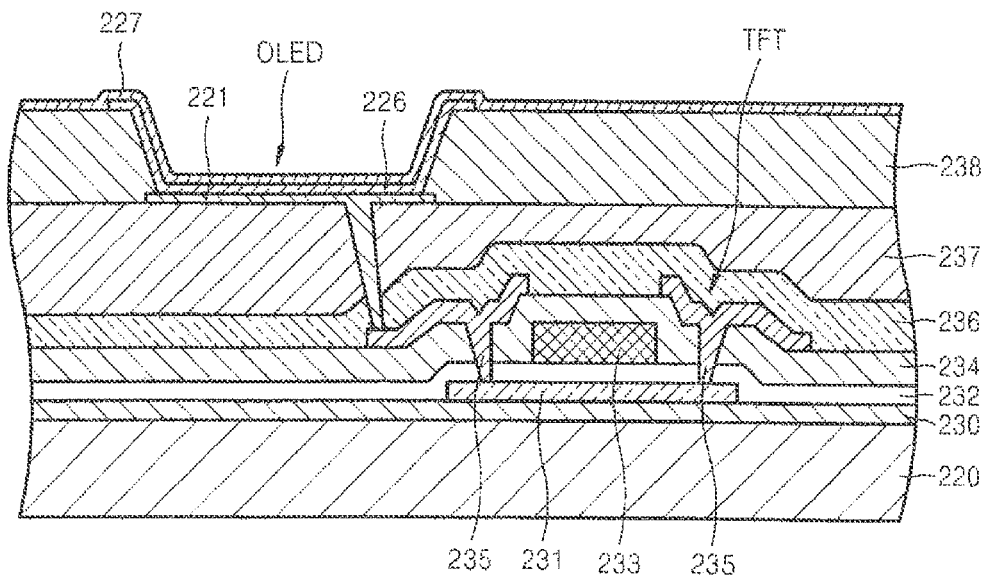
FIG. 9 is a schematic cross-sectional view of an active matrix organic light emitting display device, according to an embodiment of the present invention.

FIG. 9 is a schematic cross-sectional view of an active matrix organic light is emitting display device formed by the above-described deposition, constructed as an embodiment according to the principles of the present invention.

FIG. 9 illustrates one sub-pixel of the active matrix organic light emitting display device. Referring to FIG. 9, each sub-pixel has at least one thin film transistor (TFT) and an organic light emitting diode (OLED) being a self-emitting device. The TFT is, however, not limited to the structure illustrated in FIG. 9, and the number and structure of the TFTs may be changed variously. The active matrix organic light emitting display device of FIG. 9 will now be explained in detail.

A buffer layer 230 is formed on a substrate 220, and the aforementioned TFT is formed on buffer layer 230.

The TFT includes a semiconductor active layer 231 formed on buffer layer 230. Semiconductor active layer 231 may be formed of inorganic semiconductor or organic semiconductor, and may include a source region and a drain region which may be doped with n-type or p-type impurities and a channel region that connects the source region and the drain region to each other.

A gate insulating layer 232 is formed to cover semiconductor active layer 231. Gate insulating layer 232 may be formed of $S_iO_2$ and alternatively may be formed of $S_iN_x$ or the like. Alternatively, gate insulating layer 232 may be a double layer of $S102$ and $S_iN_x$ or may be formed of the other organic material.

A gate electrode 233 is formed on an upper surface of gate insulating layer 232. Gate electrode 233 may be formed of conductive metal such as MoW, Al, Cr, Al/Cu, or the like, but the present invention is not limited thereto. Various conductive materials such as conductive polymer may be used to form gate electrode 233. A region where gate electrode 233 is formed corresponds to the channel region of semiconductor active layer 231.

An interlayer insulating layer 234 is formed to cover gate electrode 233. Interlayer insulating layer 234 may be formed of $S_iO_2$, $S_iN_x$, or a compound of the two materials.

Source and drain electrodes 235 are formed on an upper surface of interlayer insulating layer 234. Source and drain electrodes 235 may be formed of the same material as the material used to form gate electrode 233. Source and drain electrodes 235 may respectively contact the source region and the drain region of semiconductor active layer 231 through contact holes formed in interlayer insulating layer 234 and gate insulating layer 232.

A passivation layer 236 formed of $S_iO_2$, $S_iN_x$, or the like may be formed on the source and drain electrodes 235. A planarization layer 237 formed of acryl, polyimide, or the like may be formed on passivation layer 236.

Although not shown in FIG. 9, the TFT may be connected to at least one capacitor.

One of source and drain electrodes 235 may be connected to the OLED, particularly, to a first electrode layer 221 that is an anode of the OLED. First electrode layer 221 may be disposed on planarization layer 237, and a pixel defining layer 238 may cover first electrode layer 221. After a predetermined opening is formed in pixel defining layer 238, the OLED may be formed.

The OLED emits red, green, and blue light according to a current flow and displays predetermined image information. The OLED includes first electrode layer 221 that is connected to one of source and drain electrodes 235 of the TFT and is supplied with positive power from the one of source and drain electrodes 235, a second electrode layer 227 that covers whole pixels and is supplied with negative power, and an organic layer 226 that is disposed between first and second electrode layers 221 and 227 and emits light. First and second electrode layers 221 and 227 may have polarities opposite to the aforementioned polarities.

Organic layer 226 includes an organic emitting layer (not shown) and may be formed by stacking a Hole Injection Layer (HIL), a Hole Transport Layer (HTL), an Electron Transport Layer (ETL), and an Electron Injection Layer (EIL) to have a single or complex structure. Various materials including copper phthalocyanine (CuPc), N,N'-Di(naphthalene-1-yl)-N,N'-diphenyl-benzidine (NPB), and tris-8-hydroxyquinoline aluminum (Alq3) may be used as an organic material to form organic layer 226. Organic layer 226, which is small molecular, undergoes deposition by using mask frame assembly 10, thereby obtaining highly precise to patterns.

In a mask frame assembly for thin film deposition constructed as an embodiment according to the principles of the present invention and a method of manufacturing an organic light emitting display device by using the mask frame assembly, unit masking pattern portions are designed by compensating the amount of shrinkage in a direction perpendicular to a direction of a tensile force applied when unit mask strips are fixed to a frame, so that positions of opening patterns of each of the unit masking pattern portions obtained after both ends of the unit mask strips are fixed to the frame correspond to desired positions of organic emitting layer patterns without errors. Thus, the quality of image display is improved due to an increase in the precision of the organic emitting layer patterns.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. A mask frame assembly for thin film deposition, comprising:

a frame including an opening portion; and a plurality of unit mask strips fixed to the frame after a tensile force is applied to both of end portions of the unit mask strips in a lengthwise direction of the unit mask strips, wherein each individual unit mask strip of the plurality of unit mask strips comprises a plurality of unit masking pattern portions, wherein each individual unit masking pattern portions comprising a plurality of opening patterns, wherein before the tensile force is applied to both of the end portions of the unit mask strips in the lengthwise direction and the unit mask strips are fixed to the frame, a width of each of the unit masking pattern portions in a widthwise direction perpendicular to the lengthwise direction increases as a function of a closeness of a portion of the unit masking pattern portion where the width is measured to a central portion of each of the unit masking pattern portions, and wherein after the tensile force is applied to both of the end portions of the unit mask strips in the lengthwise direction and the unit masking pattern portions are fixed to the frame, a distance between rightmost and leftmost opening patterns from among opening patterns existing on the same row in the widthwise direction is substantially constant in a direction from both of the end portions of each of the unit masking pattern portions in the lengthwise direction toward the central portion of each of the unit masking pattern portions.

2. The mask frame assembly of claim 1, wherein the width of each of the unit masking pattern portions in the widthwise direction increases with a predetermined curvature in the direction toward the central portion of each of the unit masking pattern portions.

3. The mask frame assembly of claim 2, wherein the predetermined curvature is determined in consideration of at least one selected from the group consisting of a thickness of each of the unit mask strips, a material of each of the unit mask strips, a size of each of the unit masking pattern portions, and a shape, a size, and a position of each of a plurality of opening patterns included in each of the unit masking pattern portions.

4. The mask frame assembly of claim 1, wherein before the tensile force is applied to both of the end portions of the unit mask strips in the lengthwise direction and the unit masking pattern portions are fixed to the frame, a distance between a left end of a leftmost opening pattern and a distance between a right end of a rightmost opening pattern from among opening patterns existing on the same row in the widthwise direction increases in a direction from both of the end portions of the unit masking pattern portions in the lengthwise direction toward the central portions of the unit masking pattern portions, wherein the distance is referred to as a total pitch.

5. The mask frame assembly of claim 4, wherein the total pitch is designed to increase with a predetermined curvature in a direction toward the central portions of the unit masking pattern portions.

6. The mask frame assembly of claim 5, wherein the predetermined curvature is determined in consideration of at least one selected from the group consisting of a thickness of each of the unit mask strips, a material of each of the unit mask strips, a size of each of the unit masking pattern portions, and a shape, a size, and a position of each of a plurality of opening patterns included in each of the unit masking pattern portions.

7. The mask frame assembly of claim 1, wherein the opening patterns of each of the unit masking pattern portions existing on the same column in the lengthwise direction are designed to be larger as the function of a closeness of the opening patterns to the central portion of the unit masking pattern portion.

8. The mask frame assembly of claim 1, wherein the opening patterns of each of the unit masking pattern portions existing on the same row in the widthwise direction are designed to be larger as the function of a closeness of the opening patterns to end portions of the unit masking pattern portion in the widthwise direction.

9. The mask frame assembly of claim 1, wherein in each unit mask strip, the central portions of the unit masking pattern portions are approximately constantly aligned with end portions of the unit masking pattern portions in the lengthwise direction to form a substantially straight line.

10. The mask frame assembly of claim 1, wherein the plurality of opening patterns of each of the unit masking pattern portions have dot shapes and are arranged in a zigzag manner.

11. The mask frame assembly of claim 1, wherein the plurality of opening patterns of each of the unit masking pattern portions have a shape of strips.

12. The mask frame assembly of claim 1, wherein the plurality of opening patterns of each of the unit masking pattern portions have dot shapes and are aligned with one another.

13. The mask frame assembly of claim 1, wherein the plurality of unit mask stripes have a predetermined tension.

14. The mask frame assembly of claim 1, wherein the plurality of unit mask stripes comprise nickel or a nickel alloy.

15. The mask frame assembly of claim 1, wherein each of the plurality of unit mask stripes further comprises a blocking portion that surrounds the plurality of unit masking pattern portions.

16. The mask frame assembly of claim 1, wherein the plurality of unit mask stripes are fixed to the frame using welding.

17. The mask frame assembly of claim 16, wherein the plurality of unit mask stripes are fixed to the frame using laser welding.

* * * * *